United States Patent [19]

Tournois et al.

[11] 4,134,623

[45] Jan. 16, 1979

[54] SYSTEM FOR PROCESSING AN ELECTRIC SIGNAL USING ELASTIC SURFACE WAVES

[75] Inventors: Pierre Tournois; Charles Maerfeld, both of Paris, France

[73] Assignee: Thomson-CSF, Paris, France

[21] Appl. No.: 801,247

[22] Filed: May 27, 1977

Related U.S. Application Data

[63] Continuation of Ser. No. 629,905, Nov. 7, 1975, abandoned.

[30] Foreign Application Priority Data

Nov. 8, 1974 [FR] France ................. 74 37079

[51] Int. Cl.² ..................................... H01L 41/10
[52] U.S. Cl. .............................. 310/313; 333/30 R; 357/26
[58] Field of Search ............. 310/313; 333/30 R, 72; 357/26; 340/173 R; 235/181, 197

[56] References Cited

U.S. PATENT DOCUMENTS

| | | | |
|---|---|---|---|
| B 520,924 | 1/1976 | Coldren | 333/30 R |
| 3,826,865 | 7/1974 | Quate et al. | 310/313 X |
| 3,886,529 | 5/1975 | Bert et al. | 333/30 R |
| 3,935,564 | 1/1976 | Quate et al. | 357/26 X |
| 4,016,514 | 4/1977 | Reeder et al. | 310/313 X |
| 4,021,657 | 5/1977 | Auld | 310/313 X |
| 4,041,419 | 8/1977 | Desormiere et al. | 310/313 X |

Primary Examiner—Mark O. Budd
Attorney, Agent, or Firm—Cushman, Darby & Cushman

[57] ABSTRACT

A system realizing various processings of signals, depending on the nature, duration and form of these signals, by means of non-linear interactions between elastic surface waves or between elastic and electromagnetic waves. The system realizes the memorization of the correlation function between a first signal, which is an elastic surface wave, and a second signal which is either an electromagnetic or an elastic surface wave; the reading may be realized with an electromagnetic wave or an elastic surface wave whose pulsation equals or not that which corresponds to the spatial period of the memorized signal, thus generating correlation or convolution functions.

1 Claim, 7 Drawing Figures

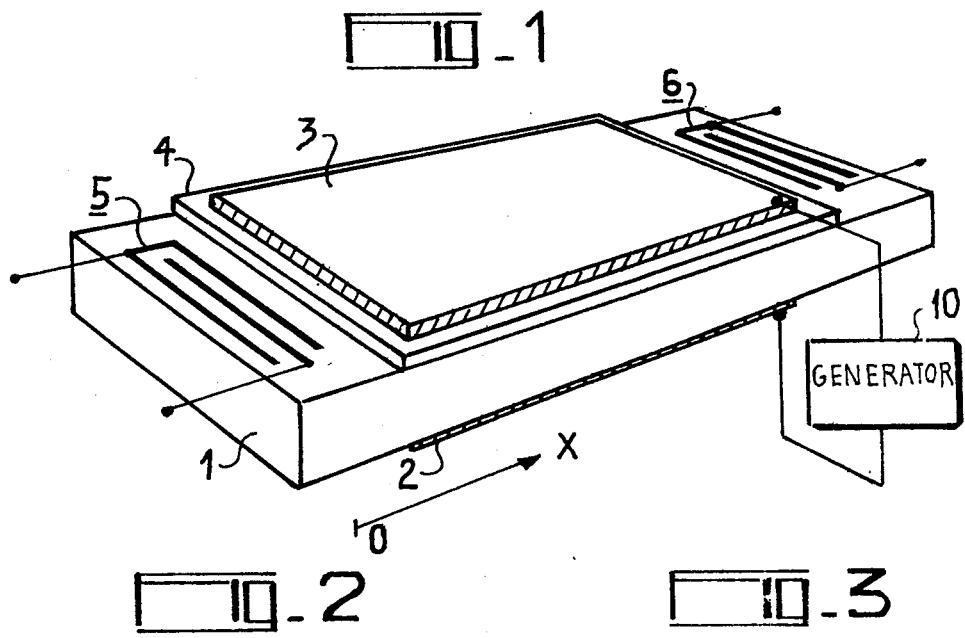
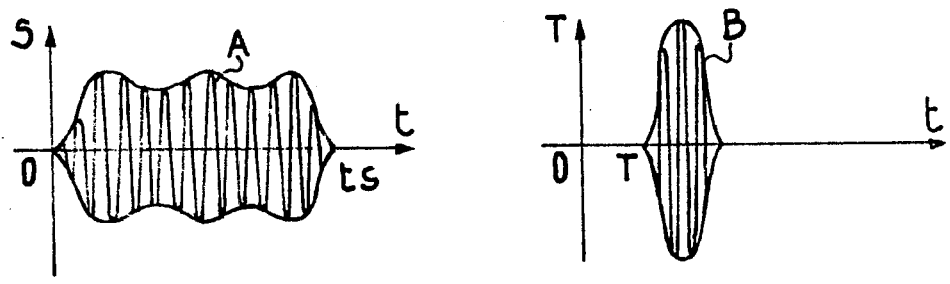
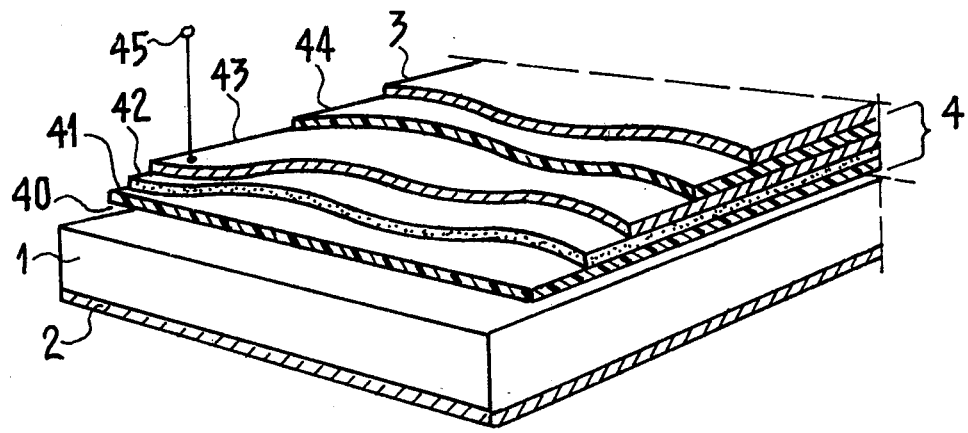

SYSTEM FOR PROCESSING AN ELECTRIC SIGNAL USING ELASTIC SURFACE WAVES

This is a continuation of application Ser. No. 629,905 filed Nov. 7, 1975, now abandoned.

The object of the present invention is to provide a system for processing an electric signal employing non-linear interactions between elastic surface waves or between elastic waves and electromagnetic waves.

It achieves more particularly the processing of signals by correlation or convolution by means of a memorizing of these signals and their interactions.

Different devices are known which employ interactions between elastic waves, that is to say vibratory disturbances of compression or shear of different frequencies for the purpose of analysis of images in amplitude and frequency without memory effect or interactions between elastic waves and electromagnetic waves for memorizing. Among these systems may be mentioned:

devices which employ a series of elementary cells, each cell being constituted by a solid-state diode or capacitor connected in series, the insulation of the capacitor having piezoelectric properties. These devices are described for example in French Pat. No. 73.45234 filed by the Applicant;

devices in which the distribution of potential of piezoelectric origin, which appears during the non-linear interaction between the elastic and electromagnetic waves, is fixed either in the piezoelectric material itself or in additional layers, thereby memorizing the interaction as described for example in French Pat. No. 74.37078 filed by the Applicant.

The object of the present invention is to provide a system for processing a signal by in particular correlation or convolution this processing is achieved by means of a prior memorizing, according to any known methods of the art, of an intermediate signal resulting from the non-linear interaction of the initial signal, converted into an elastic surface wave, with an electromagnetic or elastic wave. An output signal is obtained by producing a second non-linear interaction between the memorized intermediate signal and an electromagnetic wave or an elastic surface wave.

According to the invention, there is provided a system for processing an electric signal using elastic surface waves, comprising:

a piezoelectric substrate;

at least one electromechanical transducer receiving said signal, termed the initial signal, and emitting elastic waves on the surface of said substrate;

means for exciting an elastic or electromagnetic wave, corresponding to a second signal, interacting with said elastic waves to form a time-independent spatial potential pattern, representing the correlation function between said initial signal and said second signal;

means for fixing said pattern;

reading means exciting at least an elastic or electromagnetic wave corresponding to a third signal, interacting with said pattern to form an elastic or electromagnetic wave, termed resulting wave, which represents the convolution or correlation function between said third signal and the signal represented by said pattern.

For a better understanding of the invention and to show how the same may be carried into effect, reference will be made to the following description and the attached figures, in which:

FIG. 1 shows an embodiment of the system according to the invention;

FIGS. 2, 3 and 5 show curves representing the form of electric signals applied to the system according to the invention;

FIG. 4 shows an embodiment of the memorizing function of the pattern mentioned hereinbefore;

In these various figures same reference characters designate the same elements and the representation of the system and of the signals is to an arbitrarily chosen scale usually enlarged in order to render the drawing more clear.

FIG. 1 shows:

Figure 5:
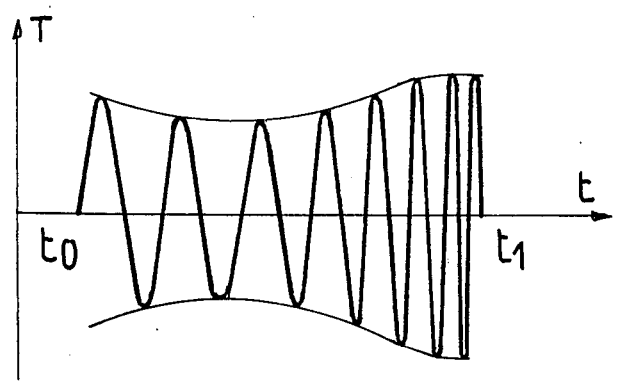

a piezoelectric substrate 1 for example in the form of a plate or slab, made of lithium niobate (LiNbO$_3$) for example, on the surface of which elastic waves are capable of being propagated;

two electromechanical transducers 5 and 6, for example of the interdigital comb type, deposited on the substrate 1 at the ends of the plate, emitting or receiving elastic waves which propagate on the surface of the substrate;

signal memorizing means, symbolically represented in the figure by a layer 4 deposited on the substrate 1 between the transducers 5 and 6 and having a double function: on the one hand, isolation and, on the other, the fixing of the pattern and one embodiment of which will be given hereinafter;

emitting and receiving means for an electromagnetic wave, constituted by two electrodes, one electrode, 2, being placed on the side of the substrate 1 opposed to the transducers and the other electrode, 3, being placed on the layer 4, these electrodes being connected to a generator 10. As concerns the operation of the system, there is a signal memorizing state -or writing stage- and a signal reading stage.

The memorization is realized in this structure, which is given merely by way of example, as described in the French Pat. Application No. 74.37078 mentioned above. Accordingly, during the memorizing stage, one of the transducers disposed on the substrate 1, for example the transducer 5, is excited by an electric signal and furnishes an elastic wave of the form:

$$S = A(t - \frac{x}{v}) \cdot \cos(\omega t - kx)$$

in which A is the amplitude of the signal, $\omega$ its pulsation, k its wave number, v the propagation velocity of the elastic waves on the surface of the substrate 1, and OX the direction of propagation of these waves, the origin 0 being taken in the middle of the interaction zone of length L. An example of such a signal is given on FIG. 2.

After that all of the signal S is converted into an elastic wave, a pulse T of short duration with respect to the duration of S, of the same pulsation $\omega$ and shown in FIG. 3, is produced by generator 10 and applied to the electrodes 2 and 3.

This pulse T creates throughout the surface of the piezoelectric substrate 1 located under the electrode 3 an electromagnetic wave of the form:

$$T = B(t) \cdot \cos \omega t$$

which interacts in a non-linear manner with the field resulting, by piezoelectric effect, from the network of strains due to the elastic wave S. The result of this instantaneous interaction at a point x is proportional to:

$$A (t - \frac{x}{v}) \cdot B (t) \cdot \cos [\omega t \pm (\omega t - kx)]$$

Theoretically, this interaction induces elastic surface waves characterized by the pair (pulsation, wave vector) resulting from the sum and the difference of the pairs characterizing the waves which interact. However, only the phase term expression which corresponds to the difference will be considered here: it is indeed the only one capable of memorizing, it being during the duration of the interaction independent of time t but only a function of the abscissa x.

As the electromagnetic wave T is not necessarily of short duration in the present case, the interaction between the two waves S and T is not instantaneous and if the response of the substrate 1 occurs with a time constant such that there is an integration of the instantaneous interactions, there is obtained at an abscissa point x the result of the following integral:

$$Q_1 (x) = \left[ \int_0^\theta A (t - \frac{x}{v}) \cdot B (t) \cdot dt \right] \cdot \cos kx$$

in which $\theta$ is the total interaction time, or:

$$Q_1 (x) = \alpha \cdot C (\frac{x}{v}) \cdot \cos kx$$

in which C is the correlation function of the signals S and T and $\alpha$ a proportionality factor. For purposes of simplification, this factor will be assumed to be equal to unity in the ensuing description.

There exists therefore at the end of the non-linear interaction, at an abscissa point x, a state of potential which is proportional to the value of the correlation function. Throughout the interaction zone there are correlation function values between C $(- L/2v)$ et C $(L/2v)$, which are spatially modulated by the factor cos kx.

This potential pattern representing the correlation function C is memorized on the substrate by the layer 4 which was said to represent symbolically any known means for fixing said potential pattern on the surface of the substrate 1; these means are for example described in the aforementioned patent applications and may consist in the modification of the surface charge or of the number of trapped electrons of a homogeneous semiconductor, or of charges stored in junctions and associated capacitors. The layer 4 is in fact integrated in the substrate 1 or constituted by additional layers usually separated from the substrate 1 by an air gap.

By way of example, FIG. 4 shows an embodiment of the layer 4 for fixing the pattern representing the information.

This figure shows the substrate 1 covered by the electrodes 2 and 3, the electrode 3 being separated from the substrate by an air gap 40, and an assembly of layers together represented by the reference numeral 4.

The substrate 1 is constituted by a piezoelectric material such as lithium niobate ($LiNbO_3$) or lead titanate zirconate (PZT). The air-gap 40 has for function to separate the layers 4 from the substrate 1 to allow the free propagation of the elastic waves over the surface of the substrate.

The assembly of layers 4 is constituted by, in succession and in the outward direction: a layer of silica 41; one or more layers 42 of silicon or amorphous semiconductor; a metallic electrode 43 connected by a connection 45 to an exterior polarization potential (not shown); an isolating layer 44.

To memorize the pattern, if the silicon layer 42 is of N-type, the electrode 43 is brought to a positive potential; there is then created a weakening in the majority carriers in the silicon layer 42. There is a certain threshold potential difference between the two faces of the dielectric 41 above which the minority carriers (positive in this example) in the silicon 42 accumulate at the interface 41-42. It is this phenomenon which is employed for memorizing the pattern by polarizing (positively) the electrode 43 in such manner, when the surface of the substrate 1 is at a uniform potential, as to be just below the threshold potential. When the distribution of the potential on the surface of the substrate 1 has a positive part, the difference of potential between the two faces of the layer 41 remains lower than the threshold value and there is no modification of the population of the charge carriers. In front of a negative part, the difference of potential between the two faces of the layer 41 becomes higher than the threshold value and there occurs an accumulation of minority carriers (positive) at the interface 41-42 which has for effect to fix the potential (negative) of the considered part and more generally the distribution of the potential on the surface of the substrate 1, which remains thus after ceasing the nonlinear interaction which had produced it.

In the memorizing stage, in accordance with a variant embodiment of the system, it is possible to excite at the same time as the transducer 5 by the signal S, the transducer 6 by a signal U which then produces an elastic wave of the form:

$$U = D (t + \frac{x}{v}) \cdot \cos (\omega t + kx)$$

The memorized signal will then be:

$$Q_2 (x) = \left[ \int_0^\theta A (t - \frac{x}{v}) \cdot D (t + \frac{x}{v}) \cdot dt \right] \cdot \cos 2 kx$$

that is to say the correlation C (2x/v) of the two signals S and U, still spatially modulated by the factor cos 2 kx but compressed by a factor 2 with respect to the preceding case. Thus in both cases there are obtained:

the correlation of two signals, for example a known signal (T or U) with an unknown signal S;

the memorizing not simply of the initial signal S but of a coded signal Q which may be for example the Fourier transform of the initial signal S if T is a linearly frequency modulated signal, like the signal shown on FIG. 5: it is a signal the frequency of which linearly increases from a minimum $f_m$ at a time $t_o$ until a maximum $f_M$ at a time $t_1$, its amplitude being modulated by the signal B.

As concerns the reading stage, an elastic or an electromagnetic wave is excited which interacts with the memorized signal (Q) to form another wave, elastic or electromagnetic waves, capable of being read.

According to a first embodiment, an elastic wave is produced from one of the transducers 5 or 6 which has the same pulsation as that which corresponds to the spatial modulation of the memorized signal. If the memorized signal is the signal $Q_1$, the elastic wave employed for the reading is of the form:

$$J_1 = R(t \pm \frac{x}{v}) \cdot \cos(\omega t \pm kx)$$

and, depending on whether the signal is applied to the transducer 6 or 5, there is obtained the plus sign or minus sign respectively.

The non-linear interaction of the signal $J_1$ and $Q_1$ gives the following signal $L_1$:

$$L_1 = \left[ \int_L C(\frac{x}{v}) \cdot R(t \pm \frac{x}{v}) \cdot dx \right] \cdot \cos 2\omega t$$

in retaining for the phase term that which corresponds to the difference or to the sum, according to the transducer emitting the signal J.

The signal $L_1$ which is obtained at the terminals of the electrodes 2 and 3 represents when modulated by the term cos ωt, either a correlation or a convolution of the signals C and R, according to the sign of R.

If the memorized signal is the signal $Q_2(x) = C(2x/v) \cdot \cos 2kx$ the elastic wave employed for reading is of the form:

$$J_2 = R(t \pm \frac{2x}{v}) \cdot \cos(2\omega t \pm 2kx)$$

The non-linear interaction of the signals $J_2$ and $Q_2$ gives the following signal $L_2$:

$$L_2 = \left[ \int_L C(\frac{2x}{v}) \cdot R(t \pm \frac{2x}{v}) \cdot dx \right] \cdot \cos 2\omega t$$

which is analogous to the signal $L_1$, apart from the compression by a factor 2.

In a second embodiment, an electromagnetic wave is produced by the electrodes 2 and 3 which has the pulsation corresponding to the spatial modulation of the memorized signal Q. Thus there is, in an analogous manner, an electromagnetic wave $K_1$ for the reading. When the memorized signal is the signal $Q_1 = C(x/v) \cdot \cos kx$:

$$K_1 = P(t) \cdot \cos \omega t$$

The interaction of these signals gives a signal $M_1$ in cos (ωt ± kx), available on one of the transducers 6 or 5.

When the memorized signal is the signal $Q_2 = C(2x/v) \cdot \cos 2kx$, there is produced for the reading an electromagnetic wave $K_2 = P(t) \cos 2\omega t$ whose non-linear interaction with $Q_2$ gives a signal $M_2$ in cos (2 ωt ± 2 kx), available on one of the transducers 6 or 5 and analogous to the signal $M_1$, apart from the compression factor.

Note that in these two embodiments, the signals L or M obtained are identical for a given memorized signal Q.

It can be seen from the expressions obtained for the output or resulting signal that the device permits different processings according to the nature, the duration and the form of the signals S, T or U and J applied thereto.

In particular, if the signal $J_1(t)$ is conjugated with the signal T(± t), that is to say if T is the pulsating response of the filter tuned to $J_1$, that is to say again $J_1(t) = T(\pm t)$, the signal S is restored with high efficiency, since the processing effects an integration throughout the interaction zone. In the second case, when $J_2(t)$ is the signal conjugated with the signal U, compressed by a factor 2, that is to say $J_2(t) = U(\pm 2t)$, the signal S is restored in the same conditions. The signals J, T and U may be for example linearly frequency-modulated pulses.

In a third embodiment of the reading stage, there are produced two waves (elastic or electromagnetic waves) whose pulsations differ from that corresponding to the spatial modulation of the memorized signal Q, which permits obtaining an output signal whose carrier frequency is different from that of the signals employed for the writing. For this purpose, it is used the structure shown on FIG. 8 which differs from the one of FIG. 1 only by adding two electromechanical transducers, 7 and 8, at the ends of the substrat 1, respectively near the transducers 5 and 6; these transducers 7 and 8 thus have a pitch different from the one of the transducers 5 and 6.

For example, two elastic waves are emitted for the reading either by the transducers 5 and 6, or in the same direction by the transducers 7 and 5. They are of the form:

$$N_1 = D_1(t - \frac{x}{v}) \cdot \cos(\omega_1 t - k_1 x)$$

$$N_2 = D_2(t \pm \frac{x}{v}) \cdot \cos(\omega_2 t \pm k_2 x)$$

If the pulsations $\omega_1$ and $\omega_2$ satisfy the equality of the wave numbers, that is to say:

$$k_1 \pm k_2 = \pm k \text{ ou } \pm 2k,$$

the interaction provides a signal of the form:

$$\left[ \int_L C(\frac{x}{v}) \cdot D_1(t - \frac{x}{v}) \cdot D_2(t \pm \frac{x}{v}) dx \right] \cdot$$
$$\cos(\omega_1 \pm \omega_2)$$

which is available between the electrodes 2 and 3.

Depending on the nature, the duration and the form of the signals $N_1$ and $N_2$, varied processings are obtained. In particular, if the amplitude $D_1$ is constant and the amplitude $D_2$ is a brief rectangular pulse, the output signal has for amplitude the correlation function C (x/v). If the two signals $N_1$ and $N_2$ have constant amplitudes $D_1$ and $D_2$, an output signal is obtained representing:

$$\int_L C(\frac{x}{v}) \cdot dx$$

If the amplitude $D_1$ is constant and the amplitude $D_2$ is conjugated with the amplitude B of the writing signal T, the amplitude A of the initial signal S is restored at the output.

Figure 7:
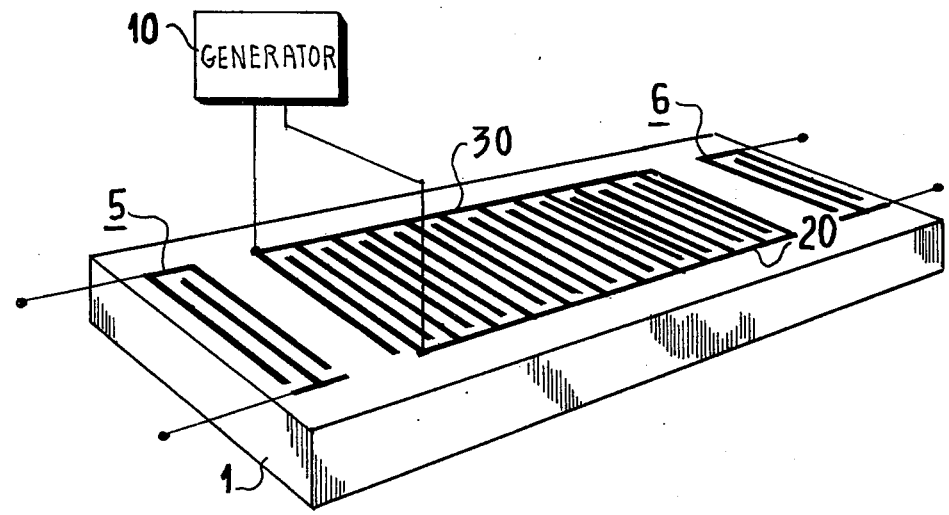
FIGS. 6 and 7 show diagrammatically variant embodiments of the system according to the invention.
Figure 6:
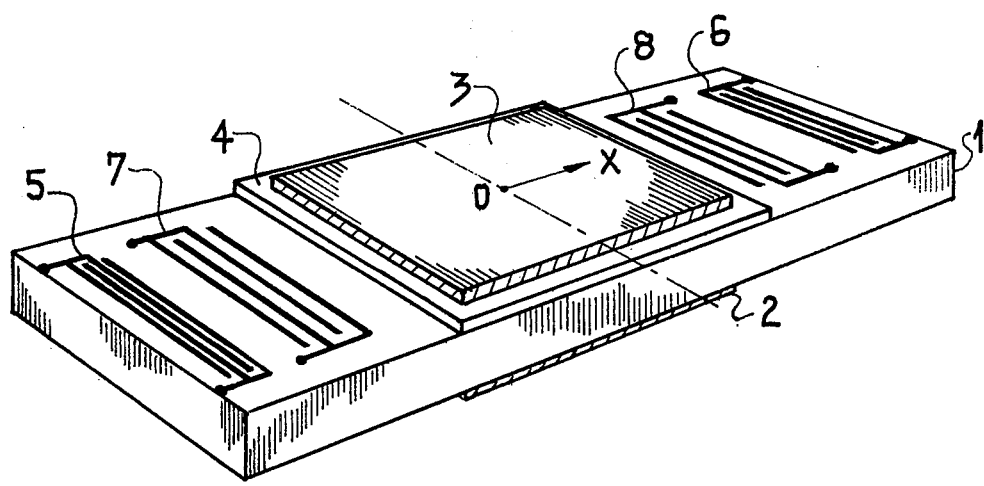

FIG. 7 illustrates a various embodiment of the electrodes 2 and 3 shown in FIG. 1 which makes possible, for example, a change in frequency between the input signal S and the output signal, or a filtering operation.

This figure shows the substrate 1 and the transducers at the end of the substrate. The function of the electrodes 2 and 3 shown in FIG. 1 is here performed by two interleaved combs 20 and 30 which have a pitch p and are placed at the centre of the substrate 1 parallel to the transducers 5 and 6, the combs 20 and 30 being connected to the generator 10. The combs 20 and 30 can be placed directly on the substrate 1 in this embodiment.

As before, there is produced the interaction of the elastic surface wave representing the signal S, characterized by the pair ($\omega$, k), emitted for example by the transducer 5, with the electromagnetic wave which represents the signal T applied between the combs 20 and 30 and is characterized by a wave number which is no longer negligible with respect to k but is equal to $2\pi/p$, in which p designates the pitch of the combs 20 and 30. The interaction has for effect to create a time independent spatial potential pattern characterized by $$(o, k \pm \frac{2\pi}{p}),$$

which is memorized on the substrate.

There is achieved a second interaction between this pattern and an elastic surface wave ($\omega_1$, $k_1$) of pulsation $\omega_1$ and wave number $k_1$ such that $k_1 = \omega_1/v$, in which v is the propagation velocity of the elastic waves on the surface of the substrate. This second interaction has for effect to produce an elastic wave characterized by the pair $$(\omega_1, k_1 \pm k \pm \frac{2\pi}{p})$$

which is only propagating if the wave number $$k = k_1 \pm k \pm \frac{2\pi}{p}$$

is such that $k = \omega^1/v$, in which case there is obtained on one of the transducers a signal whose pulsation is modified and becomes equal to that ($\omega^1$) of the elastic reading wave.

The system according to the invention may be in particular applied to the construction of computers in which the operations are carried out by the processing of elastic waves.

What is claimed is:

1. A system for processing an electric signal using elastic surface waves, comprising:
   a piezoelectric substrate,
   at least one electromechanical transducer receiving said signal, termed the initial signal, and generating elastic waves on the surface of said substrate,
   first means for exciting electromagnetic waves corresponding to a second signal, said exciting means comprising two metallic interdigital combs deposited on said surface of said substrate between which combs the electromagnetic wave is produced by application of said second signal, interacting with said elastic waves to form a time-independent spatial potential pattern, representing the correlation function between said initial signal and said second signal,
   means for fixing said pattern,
   second means for exciting at least a surface wave corresponding to a third signal, interacting with said pattern to form a further surface wave, termed a resulting wave, which represents a function selected from a group consisting of the convolution and the correlation functions, between said third signal and the signal represented by said pattern.

* * * * *